(12) United States Patent
Toyota et al.

(10) Patent No.: US 8,460,986 B2
(45) Date of Patent: Jun. 11, 2013

(54) METHOD FOR MANUFACTURING A DISPLAY DEVICE

(75) Inventors: Motohiro Toyota, Kanagawa (JP); Toshiaki Arai, Kanagawa (JP)

(73) Assignee: Sony Corporation, Tokyo (JP)

( * ) Notice: Subject to any disclaimer, the term of this patent is extended or adjusted under 35 U.S.C. 154(b) by 571 days.

(21) Appl. No.: 11/833,565

(22) Filed: Aug. 3, 2007

(65) Prior Publication Data

US 2008/0035926 A1    Feb. 14, 2008

(30) Foreign Application Priority Data

Aug. 8, 2006    (JP) ................................. 2006-215212

(51) Int. Cl.
*H01L 21/00*    (2006.01)
*H01L 21/84*    (2006.01)

(52) U.S. Cl.
USPC ........... 438/166; 438/155; 438/158; 438/149; 257/E21.535

(58) Field of Classification Search
USPC ........... 438/166, 155, 158, 149; 257/E21.535
See application file for complete search history.

(56) References Cited

U.S. PATENT DOCUMENTS

| | | | | |
|---|---|---|---|---|
| 2001/0028060 A1* | 10/2001 | Yamazaki et al. | ............... | 257/72 |
| 2003/0075733 A1* | 4/2003 | Yamazaki et al. | ............ | 257/200 |
| 2004/0142544 A1* | 7/2004 | Kimura et al. | ................ | 438/486 |

FOREIGN PATENT DOCUMENTS

| | | |
|---|---|---|
| JP | 64-002088 | 1/1989 |
| JP | 08-293464 | 11/1996 |
| JP | 10-270696 | 10/1998 |
| JP | 2000-315652 | 11/2000 |
| JP | 2001-044133 | 2/2001 |
| JP | 2002-132184 | 5/2002 |
| JP | 2002-231955 | 8/2002 |
| JP | 2003-241688 | 8/2003 |
| JP | 2003-255856 | 9/2003 |
| JP | 2003-257859 | 9/2003 |
| JP | 2005-101553 | 4/2005 |
| JP | 2005-158943 | 6/2005 |

OTHER PUBLICATIONS

Japanese Office Action issued on Jan. 17, 2012 in connection with counterpart JP Application No. 2006-215212.

* cited by examiner

*Primary Examiner* — Shouxiang Hu
(74) *Attorney, Agent, or Firm* — Dentons US LLP

(57) ABSTRACT

An active matrix type display device, wherein a pixel circuit is formed using a plurality of thin film transistors in which thin semiconductor films forming channel regions of the thin film transistors are made in different crystal states.

8 Claims, 9 Drawing Sheets

METHOD FOR MANUFACTURING A DISPLAY DEVICE

CROSS REFERENCES TO RELATED APPLICATIONS

The present invention contains subject matter related to Japanese Patent Application JP 2006-215212 filed with the Japan Patent Office on Aug. 8, 2006, the entire contents of which being incorporated herein by reference.

BACKGROUND OF THE INVENTION

1. Field of the Invention

The present invention relates to an active matrix type display device in which a pixel circuit is formed using a plurality of thin film transistors, and a method of manufacturing the display device.

2. Description of the Related Art

As a flat panel display, a display device in which an organic EL element using electroluminescence of an organic material is provided for each pixel has been attracting attention. This display device, that is, the organic EL display has excellent features of a wide viewing angle, low power consumption and the like because the organic EL display uses a light emitting phenomenon of organic EL elements themselves. In addition, because the organic EL display makes fast response to a high-definition high-speed video signal, development has been underway to put the organic EL display to practical use particularly in a video field and the like.

Of driving systems of the organic EL display, an active matrix system in which a driving pixel circuit is provided for an organic EL element of each pixel excels an existing passive matrix system in response time and resolution. Thus, the active matrix system is considered to be a driving system capable of fully bringing out features of organic EL elements.

The above-described pixel circuit is formed using thin film transistors (TFTs). Because the organic EL element in particular is a current-driven element, variations in current due to characteristic variations and deterioration of the thin-film transistors forming the pixel circuit in an organic EL display using the organic EL element directly lead to degradation in picture quality. Accordingly, a constitution in an active matrix type organic EL display has been proposed which constitution corrects the characteristic variations of the thin-film transistors by devising a pixel circuit (see Japanese Patent Laid-Open No. 2003-255856).

Another example of the flat panel display is an active matrix type liquid crystal display device. In this liquid crystal display device, a constitution has been proposed in which, for light resistance, an active element (thin film transistor) of a pixel part is formed by amorphous silicon or crystalline silicon, and an active element of a peripheral driving circuit is formed by single-crystal silicon (see Japanese Patent Laid-Open No. Sho 64-2088).

SUMMARY OF THE INVENTION

Thin film transistors used for driving in a flat panel type display device include a TFT using an amorphous silicon film as a channel region (amorphous silicon TFT) and a TFT using, as a channel region, a polycrystalline silicon film obtained by crystallizing an amorphous silicon film by laser annealing (polycrystalline silicon TFT).

Of the thin film transistors, the amorphous silicon TFT has features of small characteristic variations between elements and reduced off current as compared with the polycrystalline silicon TFT. It is therefore considered that display variations between pixels can be reduced by forming a pixel circuit using the amorphous silicon TFT. However, it is known that the threshold voltage of the amorphous silicon TFT is shifted when a voltage continues being applied to the gate electrode. Some of the thin film transistors of an organic EL display need to maintain a conducting state as long as organic EL elements are made to emit light, and thus tend to cause the above-described threshold voltage shift. Thereby amounts of current flowing through the organic EL elements are changed. As a result, variations in luminance between the organic EL elements of pixels occur.

On the other hand, the polycrystalline silicon TFT has features of high carrier mobility, which is about 10 times or 100 times that of the amorphous silicon TFT, and less degradation in threshold value and on current with the passage of time. Thus, by forming a pixel circuit using the amorphous silicon TFT, it is possible to reduce variations in luminance due to degradation of amounts of current flowing through the organic EL elements. However, the polycrystalline silicon TFT generally has a high off current. Therefore, when this polycrystalline silicon TFT is used for an on-off control TFT for writing a driving transistor gate voltage, variations in off current result in variations in luminance between organic EL elements of pixels.

It is accordingly desirable to provide an active matrix type display device that can reduce display variations between pixels.

The present invention relates to an active matrix type display device in which a pixel circuit for driving a pixel electrode is provided for each pixel. The present invention is characterized particularly in that a pixel circuit is formed using a plurality of thin film transistors in which thin semiconductor films forming channel regions of the thin film transistors are made in different crystal states.

The channel regions of the plurality of thin film transistors in the pixel circuit can be set in crystal states suited to characteristics necessary for the respective thin film transistors. For example, when the driving transistor directly connected to the pixel electrode is required to pass a high current through the pixel electrode stably for a long time, the channel region of the driving transistor is heightened in crystallinity so as to satisfy such a requirement. On the other hand, when small characteristic variations between pixels and low off current are required of the switching transistor for controlling the driving transistor, the channel region of the switching transistor is made lower in crystallinity or made amorphous so as to satisfy such a requirement.

The present invention is also a method of manufacturing the above-described display device, and is characterized by partially increasing the crystallinity of a thin semiconductor film within each pixel by laser light irradiation after forming the thin semiconductor film on a substrate. Thereby a plurality of thin film transistors having channel regions that are different from each other in crystallinity are formed within the same pixel.

According to the present invention described above, the crystallinity of channel regions in a plurality of thin film transistors forming a pixel circuit in an active matrix type display device can be set in different states according to required transistor characteristics and required degradation characteristics. Therefore variations in luminance between pixels can be reduced to a small degree.

DETAILED DESCRIPTION OF THE PREFERRED EMBODIMENTS

Preferred embodiments of a display device and a manufacturing method according to the present invention will hereinafter be described in detail with reference to the drawings.
<Configuration of Display Device>

Figure 1:
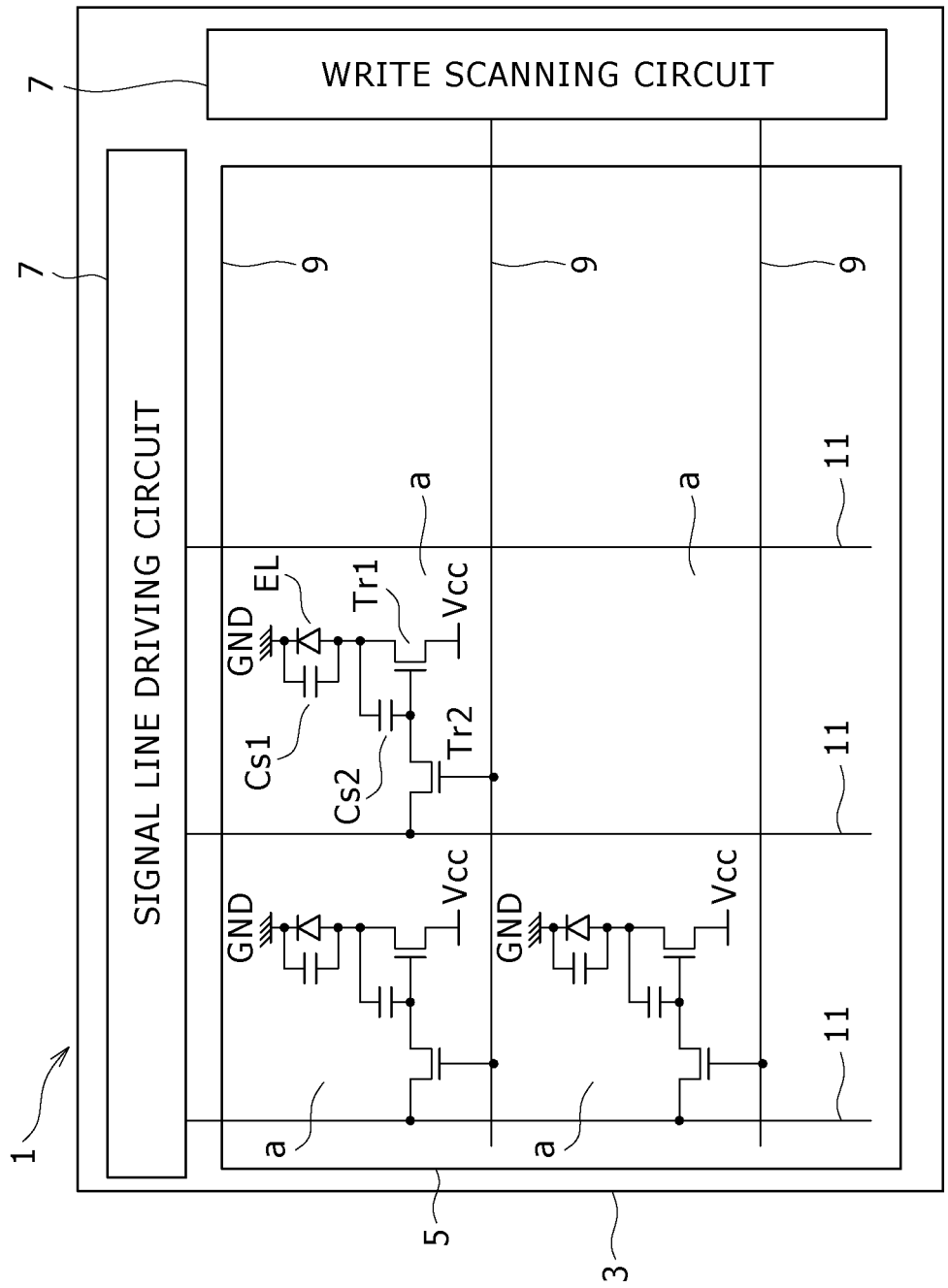
FIG. 1 is a diagram of a circuit configuration of a display device according to an embodiment.

FIG. 1 is a diagram of a circuit configuration of a display device according to an embodiment. The display device 1 shown in this figure is an active matrix type display device using an organic electroluminescent element EL. A display region 5 and a peripheral region 7 are set on a substrate 3.

A plurality of scanning lines 9 and a plurality of signal lines 11 are arranged horizontally and vertically in the display region 5. A pixel circuit a is provided in each of pixels corresponding to parts where the scanning lines 9 and the signal lines 11 intersect each other. The pixel circuit a includes for example an organic electroluminescent element EL, two capacitive elements Cs1 and Cs2, a driving transistor Tr1, and a switching transistor Tr2.

Of these elements, the organic electroluminescent element EL has a cathode electrode connected to a ground potential GND. The capacitive element Cs1 is connected in parallel with the organic electroluminescent element EL. In addition, the organic electroluminescent element EL has an anode electrode connected to the driving transistor Tr1. The source of the driving transistor Tr1 is connected to a power supply line Vcc having a positive potential (Vcc). The capacitive element Cs2 is connected to the gate of the driving transistor Tr1 and the anode electrode of the organic electroluminescent element EL. Further, the gate of the driving transistor Tr1 is connected with the source of the switching transistor Tr2. This switching transistor Tr2 has a gate connected to a scanning line 9, and has a drain connected to a signal line 11.

In the pixel circuit a of such a configuration, the driving transistor Tr1 is a transistor for passing a current through the organic electroluminescent element EL. The switching transistor Tr2 is a transistor for on/off control of the pixel circuit a and writing a voltage for driving the driving transistor Tr1 to the capacitive element Cs2.

Figure 2:
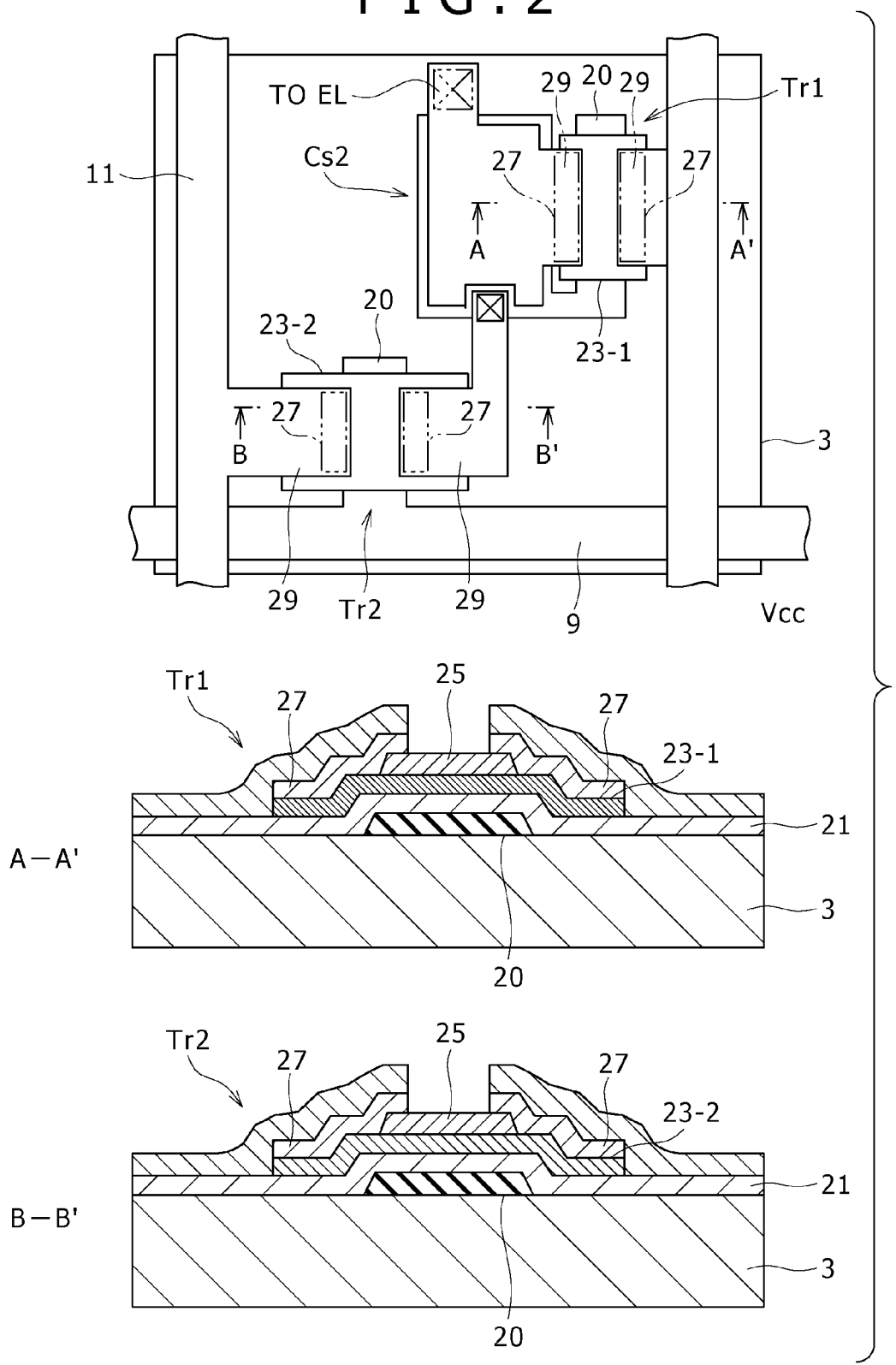
FIG. 2 includes an enlarged plan view of one pixel part in the display device according to the embodiment, a sectional view taken along a line A-A' of the plan view, and a sectional view taken along a line B-B' of the plan view.

FIG. 2 includes an enlarged plan view of one pixel circuit a, a sectional view taken along a line A-A' in a part of a driving transistor Tr1 in the plan view, and a sectional view taken along a line B-B' in a part of a switching transistor Tr2, the views being of assistance in explaining characteristic parts of the display device 1 of the configuration as described above. Incidentally, the plan view does not show an insulating film.

As shown in these views, each of the transistors Tr1 and Tr2 forming each pixel circuit is formed by a thin film transistor, and a high crystallinity film 23-1 and a low crystallinity film 23-2 formed by a thin silicon semiconductor film are patterned over a gate electrode 20 provided on the substrate 3 with a gate insulating film 21. The high crystallinity film 23-1 and the low crystallinity film 23-2 form a channel region in the respective transistors Tr1 and Tr2. A point of the present invention is a difference between crystal states of the high crystallinity film 23-1 and the low crystallinity film 23-2 formed by a thin semiconductor film in the respective transistors Tr1 and Tr2.

Specifically, the high crystallinity film 23-1 forming the channel region of the driving transistor Tr1 is formed by a thin polycrystalline semiconductor film having a relatively high crystallinity so as to be able to pass a high current through the organic electroluminescent element EL. Suppose that the high crystallinity film 23-1 has a sufficiently high crystallinity to be able to achieve a current value necessary for driving the organic electroluminescent element EL.

On the other hand, the low crystallinity film 23-2 is formed by a thin semiconductor film that has a lower crystallinity than the high crystallinity film 23-1 and may be an amorphous film. Suppose that the low crystallinity film 23-2 has a sufficiently low off characteristic in a range not higher than a permissible value at which a voltage written to the capacitive element Cs2 can be retained sufficiently.

Incidentally, in the present embodiment, a configuration in which a pixel circuit has two driving transistors Tr1 and Tr2 has been described for simplicity of description. However, a pixel circuit may have a larger number of thin film transistors. In this case, a thin film transistor provided to adjust an amount of current to be passed through an organic electroluminescent element EL has a channel region formed by a high crystallinity film 23-1. On the other hand, a thin film transistor provided to write a voltage to a capacitive element has a channel region formed by a low crystallinity film 23-2. Other thin film transistors forming the pixel circuit each have a channel region formed in an appropriate crystal state (crystallinity) according to a characteristic necessary for the thin film transistor.

An insulative etching stopper layer 25 (shown in only the sectional views) is provided on the semiconductor films 23-1 and 23-2 as described above in such a manner as to be laid over the center of the gate electrode 20. Further, a source/ drain 27 formed by thin semiconductor films separated from each other on the etching stopper layer 25 is laminated on the high crystallinity film 23-1 and the low crystallinity film 23-2. A source/drain electrode 29 formed of a conductive material is provided on the source/drain 27.

In the active matrix type display device 1 including pixel circuits formed as described above, the semiconductor films forming respective channel regions in the transistors Tr1 and Tr2 forming a pixel circuit a are the high crystallinity film 23-1 and the low crystallinity film 23-2 in different crystal states. Thus, the transistors Tr1 and Tr2 have characteristics necessary for the transistors Tr1 and Tr2, respectively.

Specifically, the driving transistor Tr1 for controlling the light emission of the organic electroluminescent element EL has the channel region thereof formed by using the high crystallinity film 23-1 having a high carrier mobility and less shifted in threshold voltage, thereby making it possible to make a display with the current value held high in a stable state. On the other hand, the switching transistor Tr2 for performing the on/off control of the pixel circuit has the channel region thereof formed by using the low crystallinity film 23-2 having a low off current and with small variations between pixels, thereby making it possible to reliably perform on/off control of the pixel circuits without variations between the pixels.

The active matrix type display device 1 can thus make a display with display variations between the pixels reduced to a small degree.

<First Method of Manufacturing Display Device>

A first example of a method of manufacturing the above-described display device 1 will next be described with reference to sectional process views of FIGS. 3A to 3E. The sectional process views of FIGS. 3A to 3E correspond to sectional parts of the section A-A' and the section B-B' in FIG. 2. Incidentally, description will be made below of a manufacturing method in which a plurality of thin film transistors forming pixel electrodes are made differently, while the manufacture of the capacitive elements connected to these thin film transistors is the same as an existing manufacture, and is performed in the same process that manufactures the thin film transistors where possible.

Figure 3A:
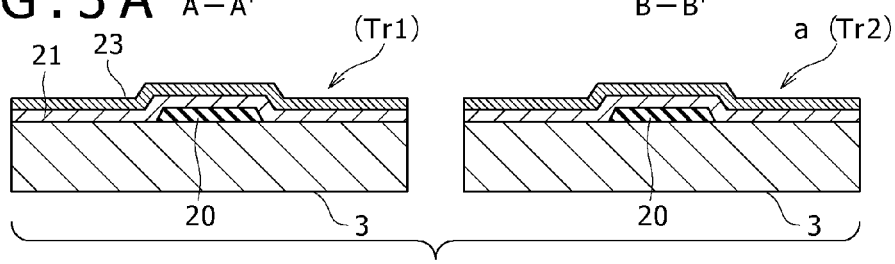
FIGS. 3A to 3E are sectional process views of a first example of a method of manufacturing the display device according to the embodiment.

First, as shown in FIG. 3A, a gate electrode 20 is formed on a substrate 3. In this case, the gate electrode 20 of molybdenum is formed by patterning a molybdenum film formed by a sputtering method by photolithography and etching. Incidentally, scanning lines and the lower electrodes of the capacitive elements are formed as occasion demands in the same step that forms the gate electrode 20.

Next, a gate insulating film 21 of a laminate structure of a silicon nitride film and a silicon oxide film, for example, and an amorphous silicon film 23 as a thin semiconductor film are formed on the substrate 3 in this order in a state of covering the gate electrode 20 and the other electrodes. These films are formed by a CVD method.

After the above step, though not shown in the figure, a silicon oxide film having a film thickness of 30 nm is formed as a buffer layer for preventing diffusion of impurities into the amorphous silicon film 23, and further a molybdenum film having a film thickness of 200 nm or a diamond like carbon (DLC) film having a film thickness of 400 nm, for example, is formed as a photothermal conversion layer. Incidentally, when the wavelength of a laser light used in a laser light irradiation to be performed next is in a waveform range in which the laser light is absorbed by the amorphous silicon film 23, the buffer layer and the photothermal conversion layer do not need to be formed.

Figure 3B:
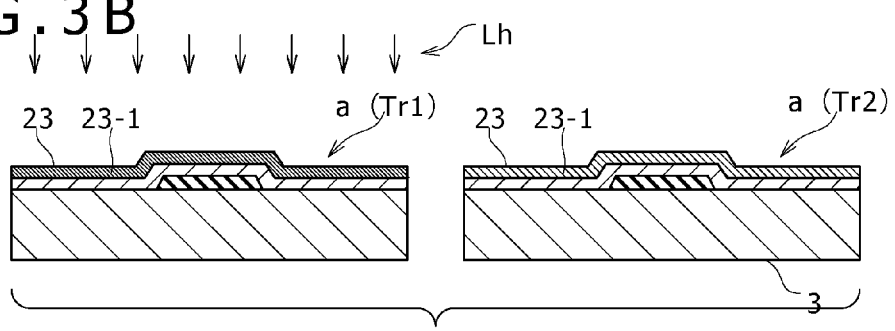

Next, as shown in FIG. 3B, the amorphous silicon film 23 is irradiated with a laser light Lh as crystallization annealing of the amorphous silicon film 23. At this time, a region a (Tr1) where the driving transistor Tr1 is formed is irradiated with the laser light Lh, and a region a (Tr2) where the switching transistor Tr2 is formed is not irradiated with the laser light Lh.

Figure 4:
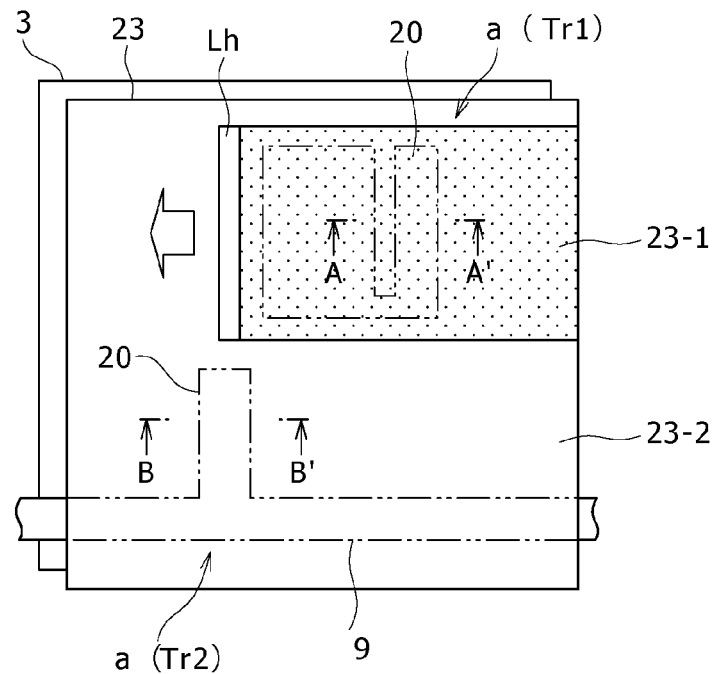
FIG. 4 is a plan view of characteristic parts in the first example of the method of manufacturing the display device according to the embodiment.

In this case, as shown in a plan view of FIG. 4, the region a (Tr1) where the driving transistor Tr1 is formed is scan-irradiated with the continuously oscillated laser light Lh (CW laser). At this time, it is important to prevent the region a (Tr2) where the switching transistor Tr2 is formed from being irradiated with the laser light Lh by adjusting the scan width of the laser light Lh. Such a laser light irradiation crystallizes the amorphous silicon film 23 in the region a (Tr1) of formation of the driving transistor Tr1 into a high crystallinity film 23-1. On the other hand, the amorphous silicon film in the region a (Tr2) of formation of the switching transistor Tr2 is left as it is to become a low crystallinity film 23-2. Incidentally, the irradiation intensity of the laser light Lh is set such that the high crystallinity film 23-1 meeting characteristics necessary the driving transistor Tr1 is obtained.

In order to facilitate the scanning of the formation region a (Tr1) excluding the formation region a (Tr2) with the laser light Lh as described above, a layout within the pixel is set such that the formation region a (Tr1) of the driving transistor Tr1 and the formation region a (Tr2) of the switching transistor Tr2 are sufficiently separated from each other in a direction perpendicular to the scanning direction of the laser light Lh which scanning direction is indicated by an arrow in FIG. 4. Then, similarly laid out pixels are arranged along the scanning direction of the laser light Lh.

Incidentally, when the buffer layer and the photothermal conversion layer are provided, these layers are removed by etching after the laser light irradiation as described above.

Figure 3C:
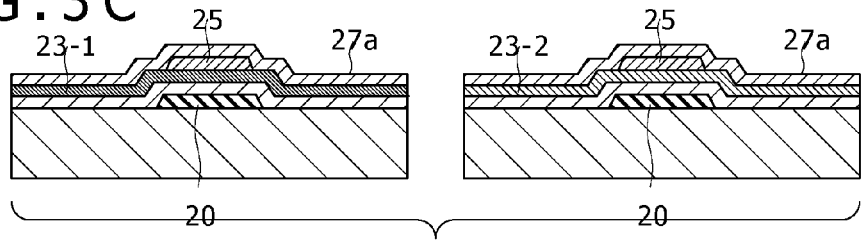

Next, as shown in FIG. 3C, each of etching stopper layers 25 made of silicon nitride is formed into a pattern at a position on the high crystallinity film 23-1 and the low crystallinity film 23-2 at which position the etching stopper layer 25 overlaps the gate electrode 20. A source/drain film 27a made of a thin semiconductor film containing an impurity is thereafter formed in a state of covering the etching stopper layers 25.

Figure 3D:
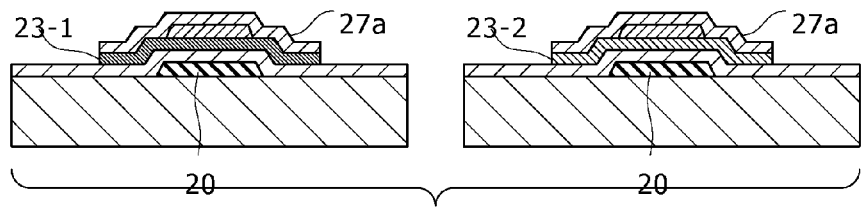

Next, as shown in FIG. 3D, the source/drain film 27a, the high crystallinity film 23-1, and the low crystallinity film 23-2 are patterned into such an external shape as to cover the gate electrode 20 completely.

Figure 3E:
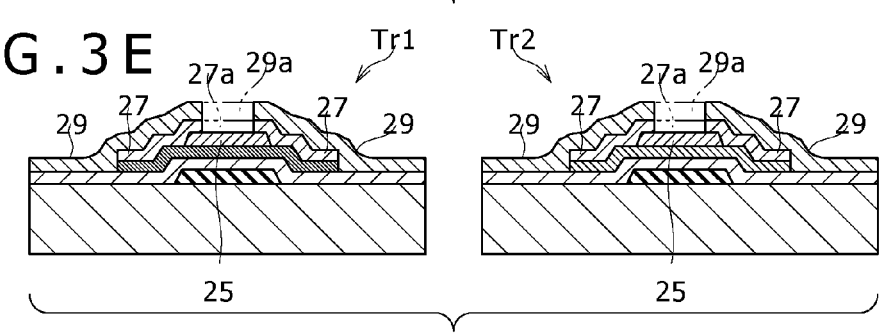

Thereafter, as shown in FIG. 3E, an electrode film 29a is formed in a state of covering the source/drain film 27a. Next, the electrode film 29a and the source/drain film 27a are patterned to be separated into a source side and a drain side on the etching stopper layers 25. A source/drain 27 resulting from separating the source/drain film 27a and a source electrode/drain electrode 29 resulting from separating the electrode film 29a are thereby formed.

As a result of the above, a driving transistor Tr1 having the high crystallinity film 23-1 as a channel region is formed in the formation region a (Tr1), and a switching transistor Tr2 having the low crystallinity film 23-2 as a channel region is formed in the formation region a (Tr2).

According to the first example of the manufacturing method, by selectively irradiating the formation region a (Tr1) within one pixel with a laser light, it is possible to crystallize the part of the amorphous silicon film 23 in the formation region a (Tr1) into the high crystallinity film 23-1, and leave the part of the amorphous silicon film 23 in the formation region a (Tr2) as it is as the low crystallinity film 23-2. As a result, the display device 1 of FIG. 1 and FIG. 2 having the plurality of thin film transistors Tr1 and Tr2 different from each other in channel region crystallinity within one pixel can be obtained.

<Second Method of Manufacturing Display Device>

Figure 5:
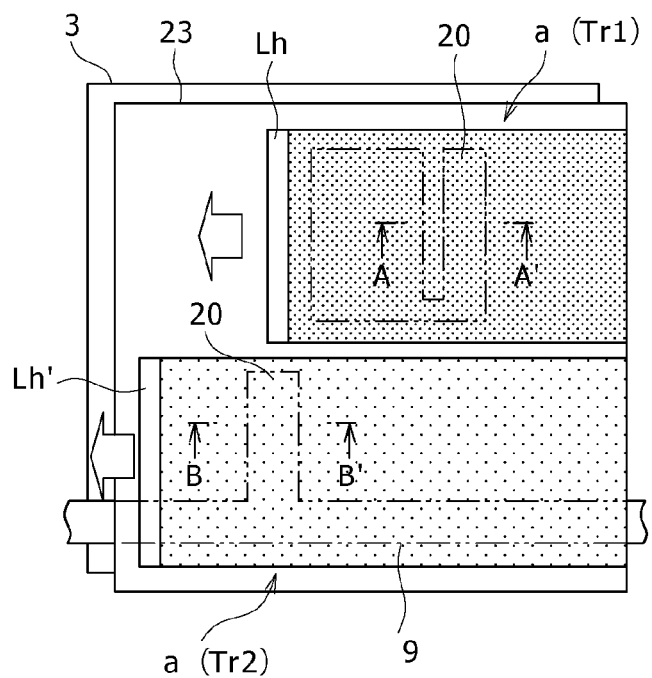
FIG. 5 is a plan view of characteristic parts in a second example of the method of manufacturing the display device according to the embodiment.

FIG. 5 is a plan view of assistance in explaining characteristic parts of a second example of the method of manufacturing the above-described display device 1. Incidentally, the second example of the manufacturing method and the first example of the manufacturing method are different from each other in only the process of crystallization annealing of the amorphous silicon film 23 by laser light irradiation, and other processes are the same, so that repeated description of the other processes will be omitted.

In the second example, in the process of crystallization annealing of an amorphous silicon film 23 by laser light irradiation, the formation region a (Tr2) of a switching transistor Tr2 is also scan-irradiated with a laser light Lh separately from the formation region a (Tr1) of a driving transistor Tr1.

At this time, the formation region a (Tr2) of the switching transistor Tr2 is scan-irradiated with a continuously oscillated laser light Lh' (CW laser) having a lower irradiation intensity than the irradiation intensity of a laser light Lh with which the formation region a (Tr1) of the driving transistor Tr1 is irradiated. Thereby a low crystallinity film 23-2 resulting from crystallizing the amorphous silicon film at a lower crystallinity than in the formation region a (Tr1) is formed in the formation region a (Tr2) of the switching transistor Tr2.

Incidentally, the irradiation intensity of the laser light Lh is set such that the high crystallinity film 23-1 meeting characteristics necessary for the driving transistor Tr1 is obtained, and the irradiation intensity of the laser light Lh' is set such that the low crystallinity film 23-2 meeting characteristics necessary for the switching transistor Tr2 is obtained.

In order to facilitate the scanning of the formation region a (Tr1) excluding the formation region a (Tr2) with the laser light Lh and the scanning of the formation region a (Tr2) excluding the formation region a (Tr1) with the laser light Lh' as described above, scanning directions of the laser light Lh and the laser light Lh' which scanning directions are indicated by arrows in FIG. 5 are set parallel with each other. In addition, a layout within the pixel is set such that the formation region a (Tr1) of the driving transistor Tr1 and the formation region a (Tr2) of the switching transistor Tr2 are sufficiently separated from each other in a direction perpendicular to the scanning directions. Then, similarly laid out pixels are arranged along the scanning directions of the laser light Lh and the laser light Lh'.

According to the second example of the manufacturing method, it is possible to form the formation region a (Tr1) and the formation region a (Tr2) of the amorphous silicon film 23 within one pixel into the high crystallinity film 23-1 and the low crystallinity film 23-2 that are different from each other in crystallinity. As a result, the display device 1 of FIG. 1 and FIG. 2 having the plurality of thin film transistors Tr1 and Tr2 different from each other in channel region crystallinity within one pixel can be obtained.

<Third Method of Manufacturing Display Device>

Figure 6:
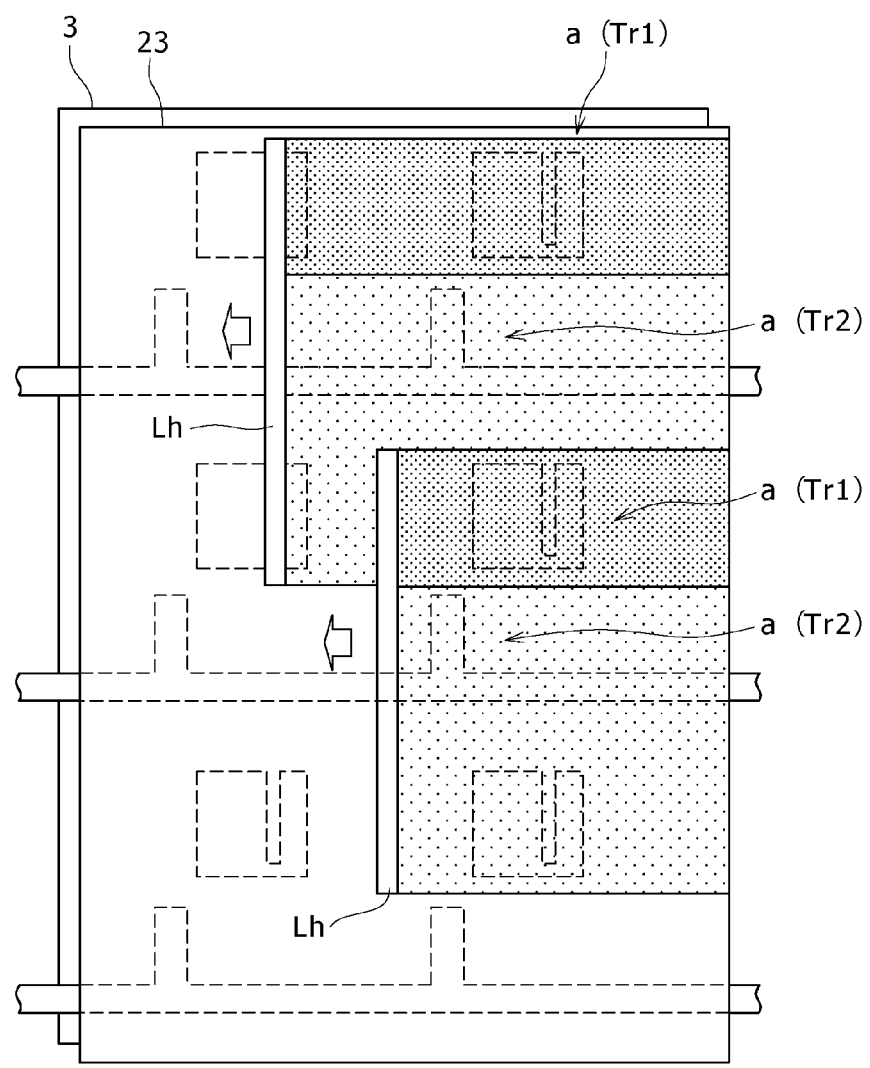
FIG. 6 is a plan view of characteristic parts in a third example of the method of manufacturing the display device according to the embodiment.

FIG. 6 is a plan view of assistance in explaining characteristic parts of a third example of the method of manufacturing the above-described display device 1. Incidentally, the third example of the manufacturing method and the first example of the manufacturing method are different from each other in only the process of crystallization annealing of the amorphous silicon film 23 by laser light irradiation, and other processes are the same, so that repeated description of the other processes will be omitted.

In the third example, in the process of crystallization annealing of an amorphous silicon film 23 by laser light irradiation, the scan width of a continuously oscillated laser light Lh is set larger than one pixel. The laser light irradiation is performed such that the formation region a (Tr1) of a driving transistor Tr1 is scanned with the laser light Lh twice such that the two scans overlap each other, while the formation region a (Tr2) of a switching transistor Tr2 is scanned with the laser light Lh once.

Thereby, in the formation region a (Tr1) of the driving transistor Tr1, the crystallization of the amorphous silicon film 23 is more advanced by a plurality of times of scanning with the laser light to obtain a high crystallinity film 23-1 having a high crystallinity. On the other hand, the formation region a (Tr2) of the switching transistor Tr2 is scanned with the laser light Lh once to obtain a low crystallinity film 23-2 having a lower crystallinity than in the formation region a (Tr1) of the driving transistor Tr1.

Incidentally, the irradiation intensity of the laser light Lh scanned once is set according to characteristics necessary for the driving transistor Tr1 and the switching transistor Tr2. When scanning the laser light Lh once is not sufficient to crystallize the amorphous silicon film 23, the amorphous silicon film 23 in the formation region a (Tr2) is left as it is as the low crystallinity film 23-2.

In order to perform the laser light irradiation as described above efficiently, the scanning directions of the laser light Lh in respective scans which scanning directions are indicated by arrows in FIG. 6 are set parallel with each other. In addition, a layout within the pixel is set such that the formation region a (Tr1) of the driving transistor Tr1 and the formation region a (Tr2) of the switching transistor Tr2 are sufficiently separated from each other in a direction perpendicular to the scanning directions. Then, similarly laid out pixels are arranged along the scanning directions of the laser light Lh.

According to the third example of the manufacturing method, it is possible to form the formation region a (Tr1) and the formation region a (Tr2) of the amorphous silicon film 23 within one pixel into the high crystallinity film 23-1 and the low crystallinity film 23-2 that are different from each other in crystal state (degree of crystallinity or crystallinity versus non-crystallinity). As a result, the display device 1 of FIG. 1 and FIG. 2 having the plurality of thin film transistors Tr1 and Tr2 different from each other in channel region crystallinity within one pixel can be obtained.

<Fourth Method of Manufacturing Display Device>

Figure 7A:
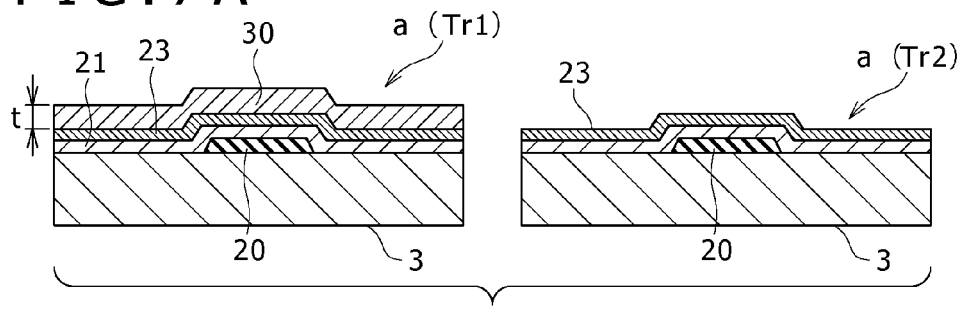
FIGS. 7A and 7B are sectional process views of assistance in explaining characteristic parts in a fourth example of the method of manufacturing the display device according to the embodiment.
Figure 7B:
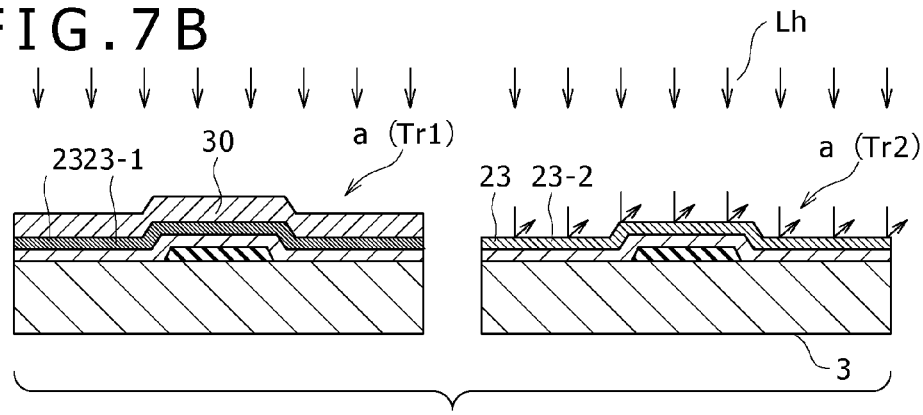

FIGS. 7A and 7B are sectional process views of assistance in explaining characteristic parts of a fourth example of the method of manufacturing the above-described display device 1.

In the fourth example of the manufacturing method, as shown in FIG. 7A, as in the first example, a gate electrode 20 is first formed on a substrate 3, a gate insulating film 21 is formed, and further an amorphous silicon film 23 is formed as a thin semiconductor film.

Thereafter a low reflection material layer 30 for laser light used in laser light irradiation to be performed next is formed into a pattern on the amorphous silicon film 23. This low reflection material layer 30 is patterned into such a form as to cover the formation region a (Tr1) of a driving transistor Tr1 and expose the formation region a (Tr2) of a switching transistor Tr2.

The low reflection material layer 30 is formed by a material that transmits light, for example a silicon nitride film or a silicon oxide film. The low reflection material layer 30 has a film thickness t such that because of a layer structure including the low reflection material layer 30, laser light incident from the low reflection material layer 30 side is supplied to the amorphous silicon film 23 (or a photothermal conversion layer) efficiently without being absorbed by the low reflection material layer 30, and is absorbed by the amorphous silicon film 23 (or the photothermal conversion layer) without being reflected from an interface between the amorphous silicon film 23 and the low reflection material layer 30.

Figure 8:
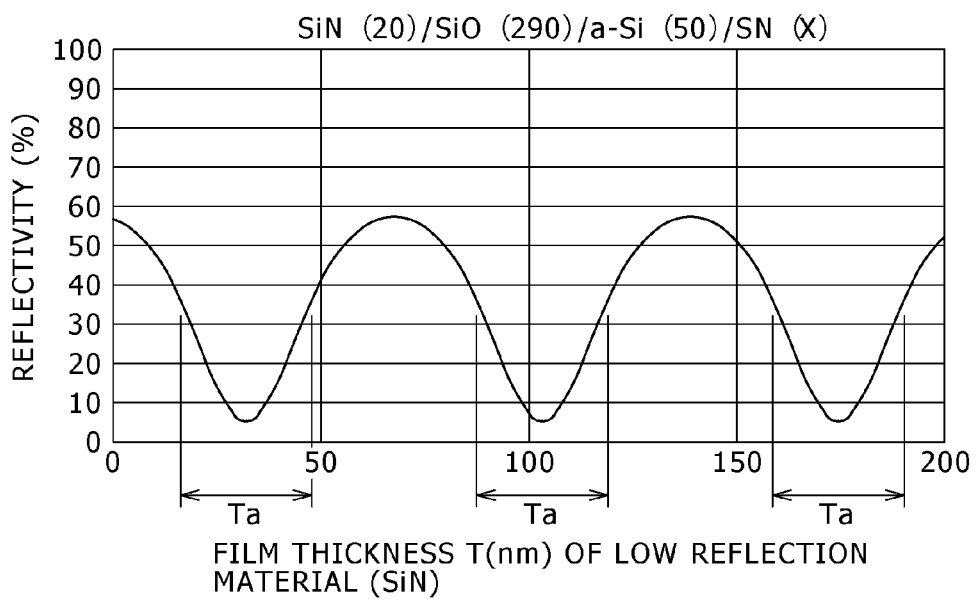
FIG. 8 is a diagram showing a result of simulation of a relation between the film thickness T of a material film (a silicon nitride film) used as a low reflection material layer in the fourth example and reflectivity of laser light.

FIG. 8 shows a result of simulation of a relation between the film thickness T of a material film (a silicon nitride film in this case) used as the low reflection material layer and reflectivity of the laser light. A layer structure in this simulation has the gate insulating film 21 formed by laminating a silicon nitride film (20 nm) and a silicon oxide film (290 nm), the amorphous silicon film 23 (50 nm), and the silicon nitride film (T nm) forming the low reflection material layer 30 in this order from the bottom on the gate electrode 20. The laser light has a wavelength λ=308 nm.

As is clear from FIG. 8, when the laser light is applied via the silicon nitride film, the reflectivity of the laser light from the silicon nitride film side periodically changes depending on the film thickness T of the silicon nitride film. Thus, on the basis of FIG. 8, the silicon nitride film having the film thickness t set within a film thickness range Ta where the reflectivity is substantially lower (for example ½ or lower) than in a case of the film thickness T of the silicon nitride film being 0 nm is patterned into a predetermined form and used as the above-described low reflection material layer 30.

Incidentally, the film thickness t of the low reflection material layer 30 is set to a value within the film thickness range Ta such that the amorphous silicon film 23 obtains a high crystallinity to such a degree as to be tolerated as a channel region of the driving transistor Tr1 in laser light irradiation of a next process.

The relation between the film thickness of the material film forming the low reflection material layer 30 and the reflectivity differs depending on the kind of light transmissive material being used and the layer structure. Therefore, an appropriate film thickness range is derived for each light transmissive material to be used, and the low reflection material layer 30 is formed with a film thickness set within the range.

Figure 9:
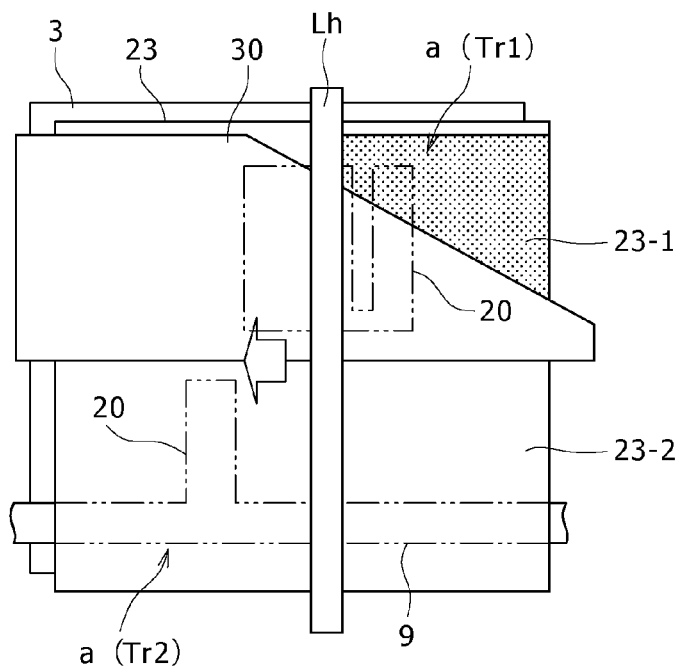
FIG. 9 is a plan view of characteristic parts in a fourth example of the method of manufacturing the display device according to the embodiment.

Thereafter, as shown in FIG. 7B, a laser light Lh having a predetermined wavelength λ (for example λ=308 nm in this case) is applied from an entire surface over the substrate 3. At this time, as is also shown in a plan view of FIG. 9, the formation region a (Tr1) of the driving transistor Tr1 and the formation region a (Tr2) of the switching transistor Tr2 are uniformly scan-irradiated with the continuously oscillated laser light Lh (CW laser). Incidentally, in FIG. 9, a part of the low reflection material layer 30 is cut away to show the under layer.

Thereby, in the formation region a (Tr1) of the driving transistor Tr1, the crystallization of the amorphous silicon film 23 is effectively advanced by reducing a loss due to reflection of the laser light Lh to obtain a high crystallinity film 23-1 having a high crystallinity. On the other hand, in the formation region a (Tr2) of the switching transistor Tr2, the laser light Lh is applied to and reflected from the amorphous silicon film 23 (or a photothermal conversion layer) without being passed through the low reflection material layer 30, and thereby the laser light Lh with which the amorphous silicon film 23 is irradiated is reduced as compared with the formation region a (Tr1). Thus a low crystallinity film 23-2 having a low crystallinity is obtained.

Incidentally, when the irradiation with the laser light Lh which irradiation is performed including a reflection loss without the laser light Lh being passed through the low reflection material layer 30 is not sufficient to crystallize the amorphous silicon film 23, the amorphous silicon film 23 in the formation region a (Tr2) is left as it is as the low crystallinity film 23-2.

Thereafter, the low reflection material layer 30 is removed by etching, and then the same processes as described above with reference to FIGS. 3C to 3E in the first example are performed to complete the display device 1. Incidentally, the low reflection material layer 30 may be left as it is as a layer forming a part of an etching stopper layer 25 without being removed.

With the fourth example of the manufacturing method, by selectively forming the low reflection material layer 30, it is possible to form the formation region a (Tr1) and the formation region a (Tr2) of the amorphous silicon film 23 within one pixel into the high crystallinity film 23-1 and the low crystallinity film 23-2 that are different from each other in crystal state (degree of crystallinity or crystallinity versus non-crystallinity). As a result, the display device 1 of FIG. 1 and FIG. 2 having the plurality of thin film transistors Tr1 and Tr2 different from each other in channel region crystallinity within one pixel can be obtained.

<Fifth Method of Manufacturing Display Device>

Figure 10A:
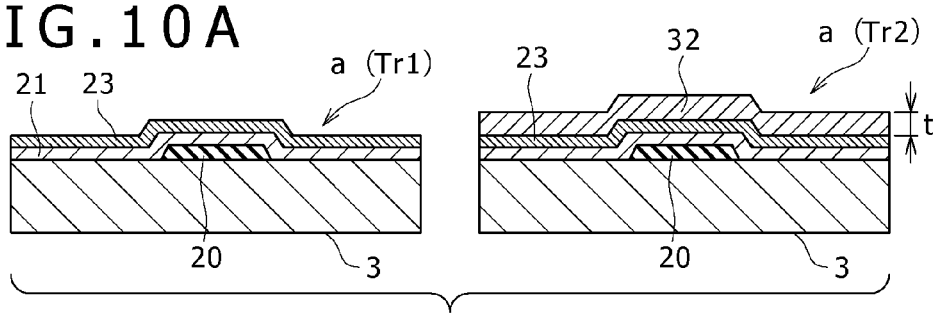
FIGS. 10A and 10B are sectional process views of assistance in explaining characteristic parts in a fifth example of the method of manufacturing the display device according to the embodiment.
Figure 10B:
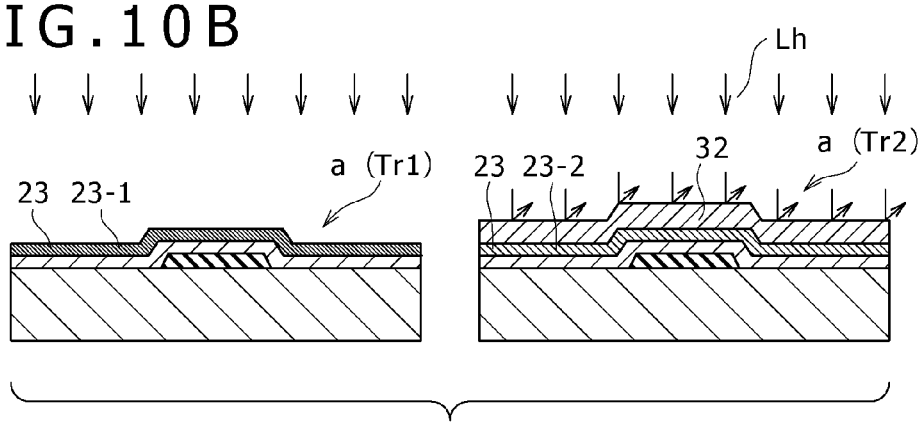

FIGS. 10A and 10B are sectional views of assistance in explaining characteristic parts of a fifth example of the method of manufacturing the above-described display device 1.

In the fifth example of the manufacturing method, as shown in FIG. 10A, as in the first example, a gate electrode 20 is first formed on a substrate 3, a gate insulating film 21 is formed, and further an amorphous silicon film 23 is formed as a thin semiconductor film.

Thereafter a high reflection material layer 32 for laser light used in laser light irradiation to be performed next is formed into a pattern on the amorphous silicon film 23. This high reflection material layer 32 is patterned into such a form as to expose the formation region a (Tr1) of a driving transistor Tr1 and cover the formation region a (Tr2) of a switching transistor Tr2.

The high reflection material layer 32 is desirably formed by a material having a low absorptance for laser light among materials that reflect laser light. The high reflection material layer 32 has a film thickness t such that because of a layer structure including the high reflection material layer 32, laser light incident from the high reflection material layer 32 side is efficiently reflected from the surface of the high reflection material layer 32 and an interface between the high reflection material layer 32 and the amorphous silicon film 23 (or a photothermal conversion layer), and does not enter the amorphous silicon film 23.

Figure 11:
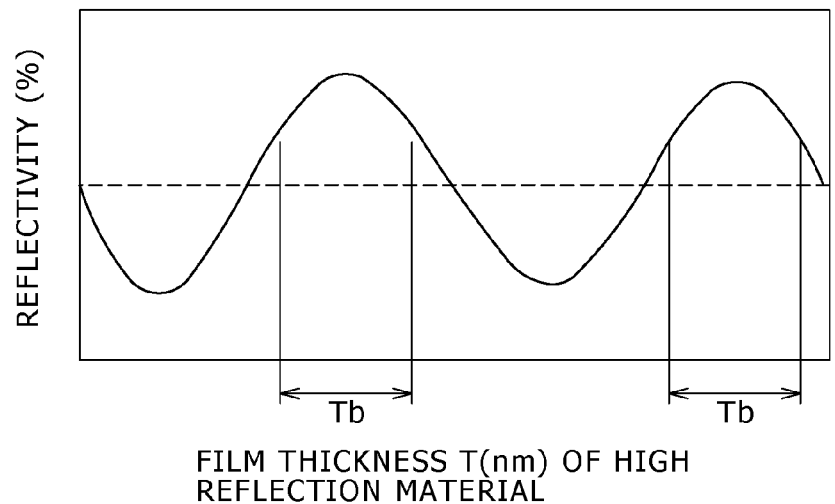
FIG. 11 is a diagram of assistance in explaining a relation between the film thickness T of a material film used as a high reflection material layer in the fifth example and reflectivity of laser light.

In this case, an insulating film such for example as a silicon nitride film or a silicon oxide film is used as the high reflection material layer 32. When the insulating film also has a transmissivity for laser light, the reflectivity of the laser light periodically changes depending on the film thickness T of the insulating film forming the high reflection material layer 32, as shown in FIG. 11. Thus, the silicon nitride film having the film thickness t set within a film thickness range Tb where the reflectivity is substantially higher than in a case of the film thickness T of the insulating film being 0 nm is patterned into a predetermined form and used as the above-described high reflection material layer 32.

Incidentally, the film thickness t of the high reflection material layer 32 is set to a value within the film thickness range Tb such that the amorphous silicon film 23 is maintained at such a low crystallinity as to be tolerated as a channel region of the switching transistor Tr2 in laser light irradiation of a next laser light irradiation process.

The relation between the film thickness T of the material film forming the high reflection material layer 32 and the reflectivity differs depending on the kind of reflective material being used and the layer structure. Therefore, an appropriate film thickness range is derived for each reflective material to be used, and the high reflection material layer 32 is formed with a film thickness set within the range.

Figure 12:
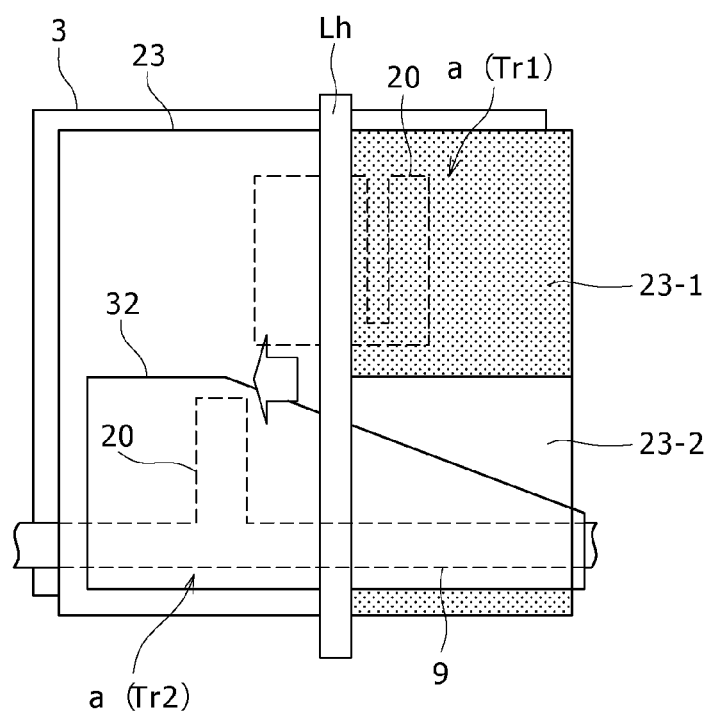
FIG. 12 is a plan view of characteristic parts in a fifth example of the method of manufacturing the display device according to the embodiment.

Thereafter, as shown in FIG. 10B, a laser light Lh having a predetermined wavelength λ (for example λ=308 nm in this case) is applied from an entire surface over the substrate 3. At this time, as is also shown in a plan view of FIG. 12, the formation region a (Tr1) of the driving transistor Tr1 and the formation region a (Tr2) of the switching transistor Tr2 are uniformly scan-irradiated with the continuously oscillated laser light Lh (CW laser). Incidentally, in FIG. 12, a part of the high reflection material layer 32 is cut away to show the under layer.

Thereby, in the formation region a (Tr1) of the driving transistor Tr1, the crystallization of the amorphous silicon film 23 is effectively advanced by reducing a loss due to reflection of the laser light Lh to obtain a high crystallinity film 23-1 having a high crystallinity. On the other hand, in the formation region a (Tr2) of the switching transistor Tr2, the laser light Lh applied to the amorphous silicon film 23 (or a photothermal conversion layer) is effectively reduced as compared with the formation region a (Tr1) by using a reflection loss of the laser light Lh. Thus a low crystallinity film 23-2 having a low crystallinity is obtained.

Incidentally, when the irradiation with the laser light Lh which irradiation includes the reflection loss is not sufficient to crystallize the amorphous silicon film 23, the amorphous silicon film 23 in the formation region a (Tr2) is left as it is as the low crystallinity film 23-2.

Thereafter, the high reflection material layer 32 is removed by etching, and then the same processes as described above with reference to FIGS. 3C to 3E in the first example are performed to complete the display device 1. Incidentally, when the high reflection material layer 32 is formed of an insulative material, the high reflection material layer 32 may be left as it is as a layer forming a part of an etching stopper layer 25 without being removed.

With the fifth example of the manufacturing method, by selectively forming the high reflection material layer 32, it is possible to form the formation region a (Tr1) and the formation region a (Tr2) of the amorphous silicon film 23 within one pixel into the high crystallinity film 23-1 and the low crystallinity film 23-2 that are different from each other in crystal state (degree of crystallinity or crystallinity versus non-crystallinity). As a result, the display device 1 of FIG. 1 and FIG. 2 having the plurality of thin film transistors Tr1 and Tr2 different from each other in channel region crystallinity within one pixel can be obtained.

<Sixth Method of Manufacturing Display Device>

FIGS. 13A to 13D are sectional views of assistance in explaining characteristic parts of a sixth example of the method of manufacturing the above-described display device 1.

Figure 13A:
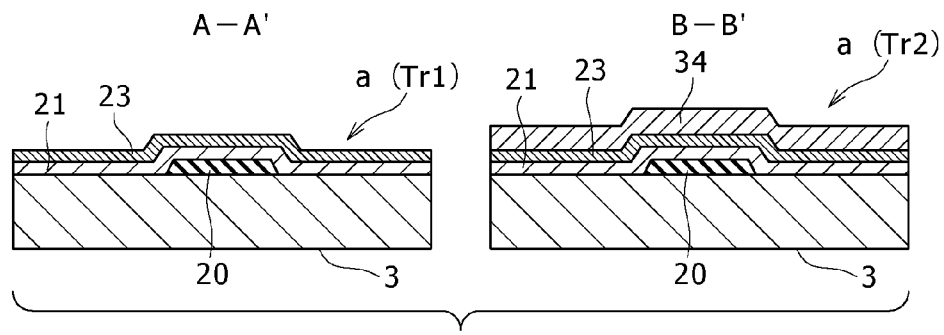
FIGS. 13A to 13D are sectional process views of assistance in explaining characteristic parts in a sixth example of the method of manufacturing the display device according to the embodiment.

In the sixth example of the manufacturing method, as shown in FIG. 13A, as in the first example, a gate electrode 20 is first formed on a substrate 3, a gate insulating film 21 is formed, and further an amorphous silicon film 23 is formed as a thin semiconductor film.

Thereafter a buffer layer pattern 34 for preventing impurity diffusion is formed into a pattern on the amorphous silicon film 23. The buffer layer pattern 34 is formed by patterning a silicon oxide film or a silicon nitride film, for example. The buffer layer pattern 34 is formed into such a shape as to expose the formation region a (Tr1) of a driving transistor Tr1 and cover the formation region a (Tr2) of a switching transistor Tr2.

Figure 13B:
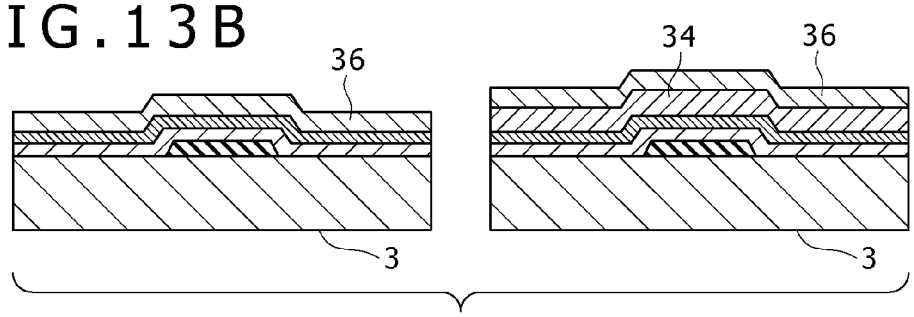

Next, as shown in FIG. 13B, a buffer layer 36 is formed over the entire surface of the substrate 3 in a state of covering the buffer layer pattern 34. The buffer layer 36 may be the same material film as the buffer layer pattern 34, and is formed by a silicon oxide film or a silicon nitride film, for example. The buffer layer 34 and 36 that is thin in the formation region a (Tr1) of the driving transistor Tr1 and thick in the formation region a (Tr2) of the switching transistor Tr2 is formed over the substrate 3.

Incidentally, the buffer layer having different thicknesses may also be formed by a method of forming a buffer layer of a uniform film thickness over the entire surface of the substrate 3 and then thinning the buffer layer in the formation region a (Tr1) of the driving transistor Tr1 by partial etching.

Figure 13C:
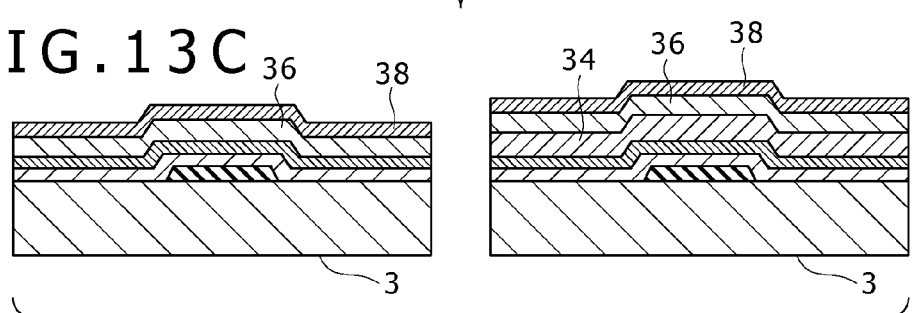

Next, as shown in FIG. 13C, a molybdenum film having a film thickness of 200 nm or a diamond like carbon (DLC) film having a film thickness of 400 nm, for example, is formed as a photothermal conversion layer 38 over the entire surface of the substrate 3 in such a manner as to cover the buffer layer 36.

Figure 13D:
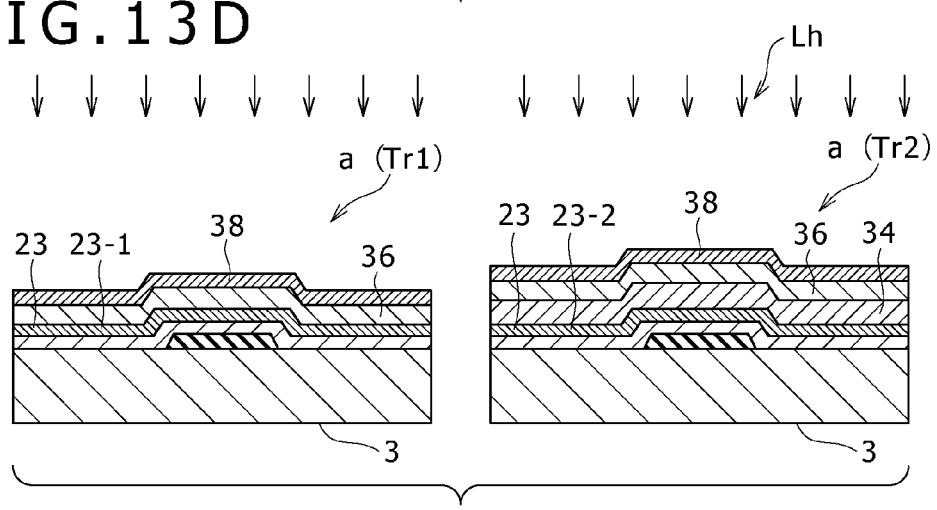

Thereafter, as shown in FIG. 13D, a laser light Lh having a predetermined wavelength λ is applied from an entire surface over the substrate 3. At this time, the formation region a (Tr1) of the driving transistor Tr1 and the formation region a (Tr2) of the switching transistor Tr2 are uniformly scan-irradiated with the laser light Lh (CW laser).

Thereby, in the formation region a (Tr1) of the driving transistor Tr1, heat resulting from conversion by the photothermal conversion layer 38 is transmitted to the amorphous silicon film 23 via the thin film part of the one buffer layer 36 to effectively advance the crystallization of the amorphous silicon film 23. Thus a high crystallinity film 23-1 having a high crystallinity is obtained. On the other hand, in the formation region a (Tr2) of the switching transistor Tr2, a loss in heat transmission in which heat resulting from conversion by the photothermal conversion layer 38 is absorbed by the thick film part of the two buffer layers 34 and 36 is effectively used to obtain a low crystallinity film 23-2 having a low crystallinity.

Incidentally, when the irradiation with the laser light Lh which irradiation includes the heat transmission loss is not sufficient to crystallize the amorphous silicon film 23, the amorphous silicon film 23 in the formation region a (Tr2) is left as it is as the low crystallinity film 23-2.

Thereafter, the photothermal conversion layer 38 and the buffer layers 34 and 36 are removed by etching, and then the same processes as described above with reference to FIGS. 3C to 3E in the first example are performed to complete the display device 1. Incidentally, the buffer layers 34 and 36 may be left as they are as a layer forming an etching stopper layer 25 without being removed.

With the sixth example of the manufacturing method, by a film thickness difference of the buffer layer 34 and 36, it is possible to form the formation region a (Tr1) and the formation region a (Tr2) of the amorphous silicon film 23 within one pixel into the high crystallinity film 23-1 and the low crystallinity film 23-2 that are different from each other in crystal state (degree of crystallinity or crystallinity versus non-crystallinity). As a result, the display device 1 of FIG. 1 and FIG. 2 having the plurality of thin film transistors Tr1 and Tr2 different from each other in channel region crystallinity within one pixel can be obtained.

It is to be noted that in the foregoing embodiments of the display device and the method of manufacturing the display device, description has been made of a case where the thin film transistors Tr1 and Tr2 are of a bottom gate type. However, the thin film transistors Tr1 and Tr2 may be of a top gate type. When the fourth to sixth examples of the manufacturing method are applied in which examples an insulative material is selectively formed into a pattern on a thin semiconductor film forming a channel region, the insulative material layer that becomes unnecessary does not necessarily need to be removed. In this case, however, the insulative material layer can be used as a gate insulating film rather than being used as an etching stopper layer in a subsequent process.

In addition, the above-described amorphous silicon film 23 formed by the CVD method may not be completely amorphous and may be the formed film of a microcrystalline film.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing an active matrix display device in which a plurality of pixel circuits are formed using a plurality of thin film transistors, each thin film transistor comprising a channel region, each channel region being in a crystalline or an amorphous state, said method comprising the steps of:
    forming a thin semiconductor film for said channel regions over a substrate; and
    selectively irradiating a portion of the thin semiconductor film using a laser light such that (i) the thin semiconductor film comprises a first portion that is irradiated and a second portion that is not irradiated (ii) the first portion has a crystallinity that is higher than that of the second portion and (iii) the first portion and second portion are formed in the same selectively irradiating step,
    wherein,
        each first portion and each second portion are arranged on the thin semiconductor film such that each first portion is adjacent to a corresponding second portion and each first portion is arranged in the same direction as the scanning direction of the laser light.

2. The display device manufacturing method according to claim 1,
    wherein one of an amorphous film and a microcrystalline film is formed in the step of forming said thin semiconductor film.

3. The display device manufacturing method according to claim 1,
    wherein said laser light irradiation is selectively performed on one part within a pixel.

4. The display device manufacturing method according to claim 1, wherein the crystalline states of the irradiated channel portions in the plurality of thin film transistors formed within said pixel are controlled by irradiation intensity of laser light at a time of said laser light irradiation.

5. The display device manufacturing method according to claim 4,
    wherein the irradiation intensity of said laser light is partially increased by partially overlapping irradiation areas of the laser light within said pixel.

6. The display device manufacturing method according to claim 4,
    wherein after a low reflection material layer for said laser light is formed on said thin semiconductor film in a state of covering one part within said pixel, said laser light irradiation is performed on a region including, as a part of said region, a region where said low reflection material layer is disposed, whereby the irradiation intensity of said laser light on said thin semiconductor film is partially increased.

7. The display device manufacturing method according to claim 4,
    wherein after a high reflection material layer for said laser light is formed on said thin semiconductor film in a state of covering one part within said pixel, said laser light irradiation is performed on a region including, as a part of said region, a region where said high reflection material layer is disposed, whereby the irradiation intensity of said laser light on said thin semiconductor film is partially decreased.

8. The display device manufacturing method according to claim 1,
    wherein after a buffer layer for preventing impurity diffusion, said buffer layer being partially different in film thickness within said pixel, is formed on said thin semiconductor film, and a photothermal conversion layer is formed on said buffer layer, said laser light irradiation is performed from above said photothermal conversion layer, whereby the crystal states of said thin semiconductor film are controlled to correspond to the film thickness of said buffer layer.

* * * * *